United States Patent
Chang et al.

(10) Patent No.: US 11,249,523 B2
(45) Date of Patent: Feb. 15, 2022

(54) ADJUSTABLE AIR BAFFLE FOR DIRECTING AIR FLOW IN A COMPUTER SYSTEM

(71) Applicant: Quanta Computer Inc., Taoyuan (TW)

(72) Inventors: Chun Chang, Taoyuan (TW); Hsin-Chieh Lin, Taoyuan (TW); Chih-Hao Chang, Taoyuan (TW); Tzu-Fong Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/988,333

(22) Filed: Aug. 7, 2020

(65) Prior Publication Data

US 2021/0349508 A1 Nov. 11, 2021

Related U.S. Application Data

(60) Provisional application No. 63/020,716, filed on May 6, 2020.

(51) Int. Cl.
*G06F 1/20* (2006.01)
*H05K 7/20* (2006.01)

(52) U.S. Cl.
CPC ............. *G06F 1/20* (2013.01); *H05K 7/2039* (2013.01); *H05K 7/20145* (2013.01)

(58) Field of Classification Search
CPC ........... H05K 7/20145; H05K 7/20736; H05K 7/1489; H05K 7/20136; H05K 1/0203; H05K 7/20; H05K 7/2039; G06F 1/20; G06F 1/203; G06F 2200/201
See application file for complete search history.

(56) References Cited

U.S. PATENT DOCUMENTS

| | | | | |
|---|---|---|---|---|
| 2005/0036287 A2* | 2/2005 | Kosugi | ................. | F04D 29/646 361/695 |
| 2005/0041392 A1* | 2/2005 | Chen | ................. | H05K 7/20727 361/695 |
| 2009/0213544 A1* | 8/2009 | Dittus | ................ | H05K 7/20727 361/695 |
| 2010/0294463 A1* | 11/2010 | Nie | ........................ | H01L 23/467 165/80.3 |
| 2010/0319886 A1* | 12/2010 | Zeng | ......................... | G06F 1/20 165/122 |
| 2011/0014861 A1* | 1/2011 | Tsai | ....................... | H01L 23/467 454/184 |
| 2011/0085298 A1* | 4/2011 | Xiao | ......................... | G06F 1/20 361/692 |
| 2011/0111838 A1* | 5/2011 | Bauer | ....................... | G06F 1/20 463/25 |
| 2011/0171899 A1* | 7/2011 | Ye | ............................ | G06F 1/20 454/284 |

(Continued)

*Primary Examiner* — Adam B Dravininkas
(74) *Attorney, Agent, or Firm* — Nixon Peabody LLP

(57) ABSTRACT

An air baffle insertable between a chassis wall and a computer component such as a GPU and heat sink mounted on a GPU tray to divert air flow to the computer component is disclosed. The air baffle includes a single sheet having a bottom panel, a top panel, and a pair of parallel side walls. Each of the parallel side walls are connected to the bottom and top panels. A first end wall is joined to the side walls and the top and bottom panel. The first end wall directs air flow toward the computer component.

20 Claims, 9 Drawing Sheets

(56) References Cited

U.S. PATENT DOCUMENTS

| | | | | |
|---|---|---|---|---|
| 2012/0120595 A1* | 5/2012 | Sun | ................... | H05K 7/20145 |
| | | | | 361/679.47 |
| 2012/0327589 A1* | 12/2012 | Sun | ......................... | G06F 1/20 |
| | | | | 361/679.47 |
| 2014/0036433 A1* | 2/2014 | Guan | ................... | H01L 23/467 |
| | | | | 361/679.32 |
| 2020/0288597 A1* | 9/2020 | Shen | ................. | H05K 7/20145 |

\* cited by examiner

ADJUSTABLE AIR BAFFLE FOR DIRECTING AIR FLOW IN A COMPUTER SYSTEM

CROSS-REFERENCE TO RELATED APPLICATIONS

This patent application claims the benefit of U.S. Provisional Patent Application No. 63/020,716, filed May 6, 2020. The contents of that application in its entirety are hereby incorporated by reference.

TECHNICAL FIELD

The present disclosure relates generally to systems and methods for optimizing thermal performance in computing devices. More particularly, aspects of this disclosure relate to a flexible air baffle structure for improved thermal performance of computing devices.

BACKGROUND

Computing systems (e.g., desktop computers, blade servers, rack-mount servers, etc.) are employed in large numbers in various applications. High demand applications, such as network based systems, data centers, or high density finite element simulations can push hardware of computing systems, causing excess heat to be generated by the hardware of the computing systems. For example, a hard-drive of a server, memory modules installed in the server, and processors of the server, etc., operating at high capacity can generate excess heat. Heat generated by computing systems is generally dissipated to avoid damage or performance degradation of such components in the computing systems. For example, excessive heat can melt interconnects of fragile electronics or can damage substrates of these electronics.

Thermal management is an important aspect of optimizing the performance of a computing system. Thermal management can be performed at component level, for example, at the level of computing system components that can heat up. Central processing units (CPUs), graphics processing units (GPUs), and dual in-line memory modules (DIMMs) are examples of components usually considered when performing component level thermal management. Other systems such as walls of fan modules may be used to circulate air throughout the computer system.

Certain high performance computing systems, such as a GPU server, require large cooling capability due to the excessive heat generated by the additional GPUs. A GPU server will typically have a chassis with two walls that enclose a motherboard with CPUs. A GPU tray holding the GPUs is suspended over the CPUs. Heat sinks are installed over the GPUs on the GPU tray to assist in heat management. A fan wall is used to pull air through the heat sinks to transfer the heated air around the heat sinks away. The efficiency of the air flow is impeded by the gaps between the heatsinks supported by the GPU tray and the walls of the chassis, as air flowing through such gaps does not carry much of the radiated heat from the heat sinks.

In such a GPU server, an air baffle is used to fill the gap between the heat sinks on the GPU tray and the chassis walls. The air baffle directs air flow in the gaps between the heat sinks on the GPU tray to increase cooling efficiency. Such systems often employ specially shaped air baffles that are molded from plastic to conform to the shape of the gaps between internal structures of such a system. Thus, thermal management at the component level involves using pre-molded air baffles to assist in directing air to such components. However, the high cost of plastic molding as well as the lack of adaptability to different server architectures make such molded air baffles undesirable.

Thus, there is a need for a flexible air baffle that can be widely used in different GPU server architectures. There is also a need for a flexible air baffle that allows easy maintenance and cable access to components in a GPU server. There is also a need for an air baffle structure that may easily be assembled and reassembled.

SUMMARY

One disclosed example is an air baffle insertable between a chassis wall and a computer component such as a GPU and heat sink mounted on a GPU tray. The air baffle includes a single sheet having a bottom panel, a top panel, and a pair of parallel side walls. Each of the parallel side walls are connected to the bottom and top panels. A first end wall is joined to the side walls and the top and bottom panel. The first end wall directs air flow toward the computer component.

A further implementation of the example air baffle is an embodiment where the first end wall is positioned at an angle relative to the plane of the side walls. Another implementation is where the first end wall includes a cutout to accommodate cables. Another implementation is where at least one of the side walls includes a protruding tab from an open edge that is inserted in a corresponding slot formed in the top panel. Another implementation is where the first end wall includes a cutout to create an opening to alter air flow blocked by the first end wall. Another implementation is where the single sheet is a flexible material cut in shapes defining the walls and panels. Another implementation is where the flexible material is polyester or plastic. Another implementation is where the computer component is a GPU tray including a GPU and a heat sink. Another implementation is where the air baffle includes a second end wall joined to the side walls and the top and bottom panel opposite the first end wall. Another implementation is where the top panel or the bottom panel have a different fold lines. A width of the top panel or the bottom panel is adjusted based on folding the top panel or bottom panel relative to the side walls along one of the fold lines.

Another disclosed example is a computing system having a chassis having two side walls. A fan module generates air flow parallel to the two side walls of the chassis. A tray holding components is located between the two side walls. An air baffle insertable between one of the side walls and the tray is provided. The air baffle includes a bottom panel, a top panel, and a pair of parallel side walls. Each of the parallel side walls is connected to the bottom and top panels. A first end wall is joined to the side walls and the top and bottom panel. The first end wall directs air flow toward the tray.

A further implementation of the example computing system is an embodiment where the first end wall is positioned at an angle relative to the plane of the side walls. Another implementation is where the first end wall is positioned at an angle relative to the plane of the parallel side walls. Another implementation is where the first end wall includes a cutout to accommodate cables. Another implementation is where at least one of the side walls includes a protruding tab from an open edge that is inserted in a corresponding slot formed in the top panel. Another implementation is where the first end wall includes a cutout to create an opening to alter air flow blocked by the first end wall. Another implementation is where the single sheet is a flexible material cut in shapes defining the walls and panels. Another implementation is where the flexible material is polyester or plastic. Another implementation is where the components include a GPU and a heat sink. Another implementation is where the air baffle includes a second end wall joined to the side walls and the top and bottom panel opposite the first end wall. Another implementation is where the top panel or the bottom panel have multiple fold lines. The width of the top panel or the bottom panel is adjusted based on folding the top panel or bottom panel relative to the side walls along one of the fold lines.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIGS. 4B-4F shows the different steps of folding the pre-fabricated sheet in FIG. 4A to create the example baffle structure shown in FIG. 3A;

Figure 1A:
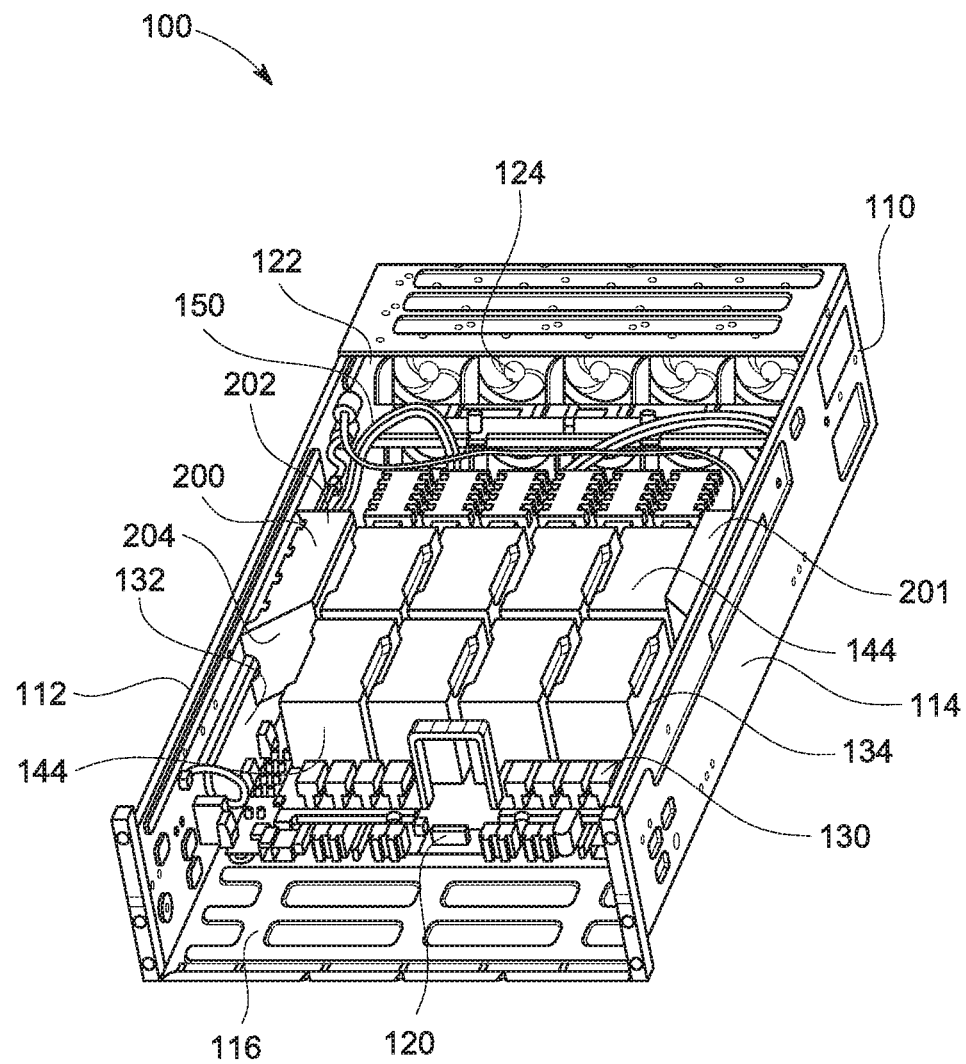
FIG. 1A is a perspective view of a computing system with an example flexible air baffle structure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to an adaptable, flexible air baffle that may be folded to channel air toward components in a computing system. The flexible air baffle may be used instead of high cost plastic molded structures currently used in computing devices, such as a GPU server. The example flexible air baffle structure allows for easy maintenance access to the components in the GPU server. Moreover, the example flexible air baffle includes cutouts that allow cable management along the sides of the GPU server. The flexible air baffle may also be assembled in different dimensional shapes.

Figure 1B:
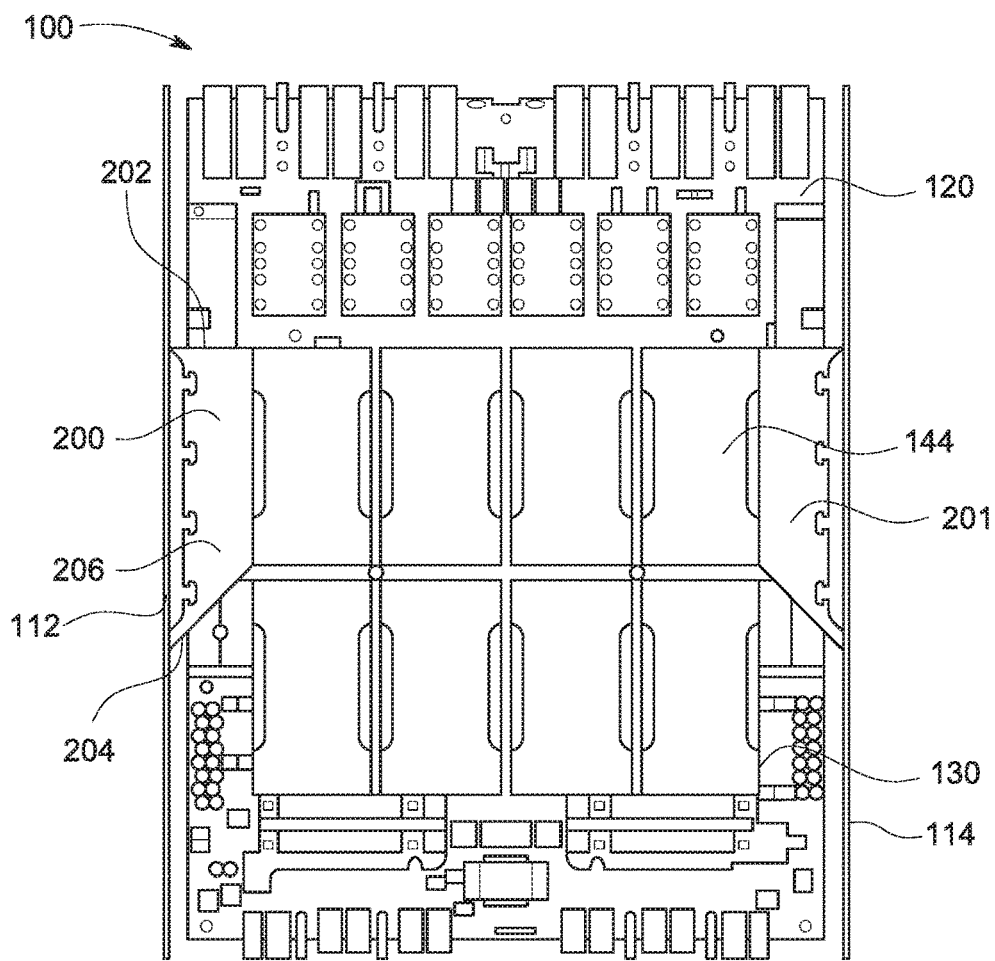
FIG. 1B is a top view of the computing system in FIG. 1A with the example flexible air baffle structure.

FIG. 1A is a perspective view of a computing device such as a GPU server 100. FIG. 1B is a top view of the GPU server 100 with the cover removed to show interior components. The GPU server 100 includes a chassis 110 with two side walls 112 and 114. The side walls 112 and 114 are joined by a bottom panel 116. A motherboard 120 is mounted between the side walls 112 and 114. The motherboard 120 is fixed between the front end and the rear end of the chassis 110. The motherboard 120 includes one or more components such as power supplies, processors such as CPUs, network interface cards, memory devices, and the like. A fan wall 122 that includes fan modules 124 is located near the rear of the chassis 110. The fan wall 122 generates air flow between the side walls 112 and 114 to assist in cooling the components of the GPU server 100.

Incoming air flow enters a front end of a chassis 110 of the GPU server 100. The incoming air flow passes through components in the chassis 110 resulting in an outgoing air current exiting a back end of the chassis 110. The fan modules 124 are configured to set a direction for the incoming air flow and the outgoing air flow, such that both the incoming air flow and the outgoing air current flow move in a same direction.

A GPU tray 130 is mounted over the CPUs of the motherboard 120. The GPU tray 130 is generally narrower than the width between the walls 112 and 114. Thus, there are gaps 132 and 134 between the walls 112 and 114 and the GPU tray 130. The GPU tray 130 holds a circuit board 140 that supports multiple GPUs. Each of the GPUs on the GPU tray 130 is in contact with a corresponding heat sink 144 that transfers heat generated by the respective GPU. Cables 150 are routed to either side of the heat sinks 144 on the tray 130. The cables 150 transmit power and data signals between the components of the GPU server 100.

An example air baffle structure 200 is inserted in the gap 132, in alignment with the GPU tray 130. Another baffle structure 201 is inserted in the gap 134 on the opposite side of the GPU tray 130 from the baffle structure 200. As will be explained, the baffle structures 200 and 201 are each assembled from a respective single pre-fabricated sheet of rigid but bendable material.

Figure 1C:
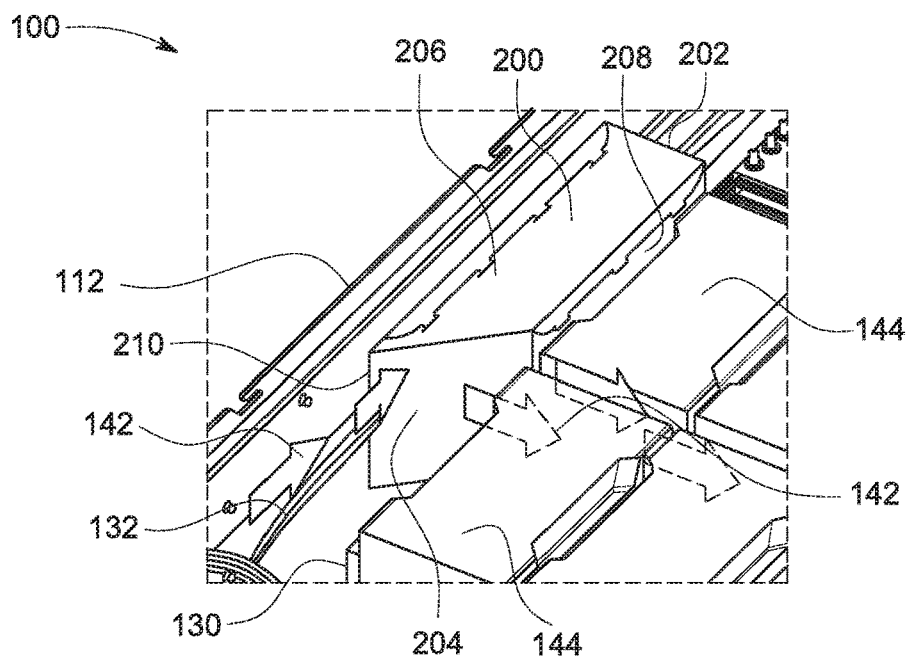
FIG. 1C is a close up perspective view of the example flexible air baffle structure in the computing system in FIGS. 1A-1B.

FIG. 1C shows a close up, perspective view of the air baffle structure 200 inserted in the gap 132 between the side wall 112 and some of the heat sinks 144 of the GPU tray 130. The air baffle structure 200 has opposite end walls 202 and 204. The end wall 204 blocks the air flow through the gap 132. The end walls 202 and 204 are joined by a trapezoid shaped top panel 206. A parallel set of side walls 208 and 210 are attached to the top panel 206. The end wall 204 of the air baffle structure 200 has an angled surface that directs air flow toward the GPU tray 130.

The air baffle structures 200 and 201 are shaped to modulate the air flowing through the chassis 110. The air baffle structures 200 and 201 modulate the air flowing through the chassis 110 by blocking or obstructing the air flow and/or directing or redirecting the air flow generated by the fan wall 122 shown in FIG. 1A. For example, the air baffle structures 200 and 201 redirect air flow toward the heat sinks 144, as shown by arrows 142 in FIG. 1C. This increases cooling efficiency in relation to the GPUs on the GPU tray 130 as more of the air flow generated by the fan wall 122 is directed to the heat sinks 144. The cables 150 are also routed through the air baffle structure 200 between the end walls 202 and 204. As will be explained, the cables 150 may be supported in the baffle structure 200 by cable clips attached to the interior of the air baffle structure 200.

Figure 2A:
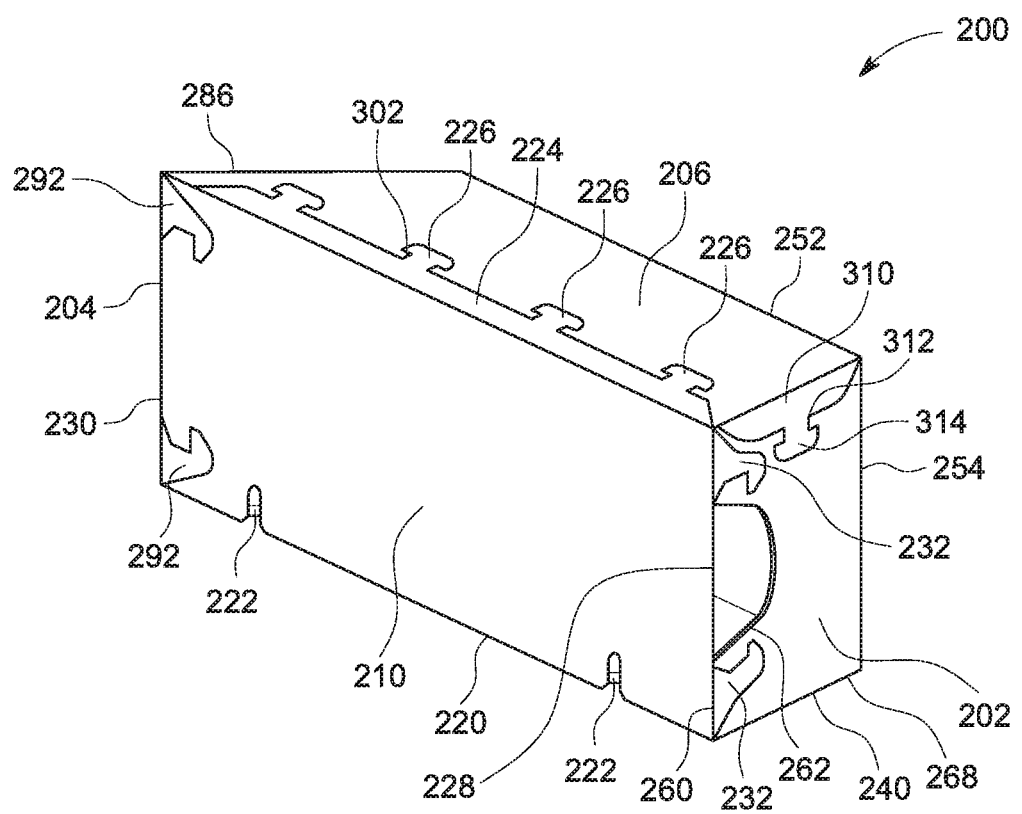
FIG. 2A is a front perspective view of the example flexible air baffle structure in FIG. 1A.
Figure 2B:
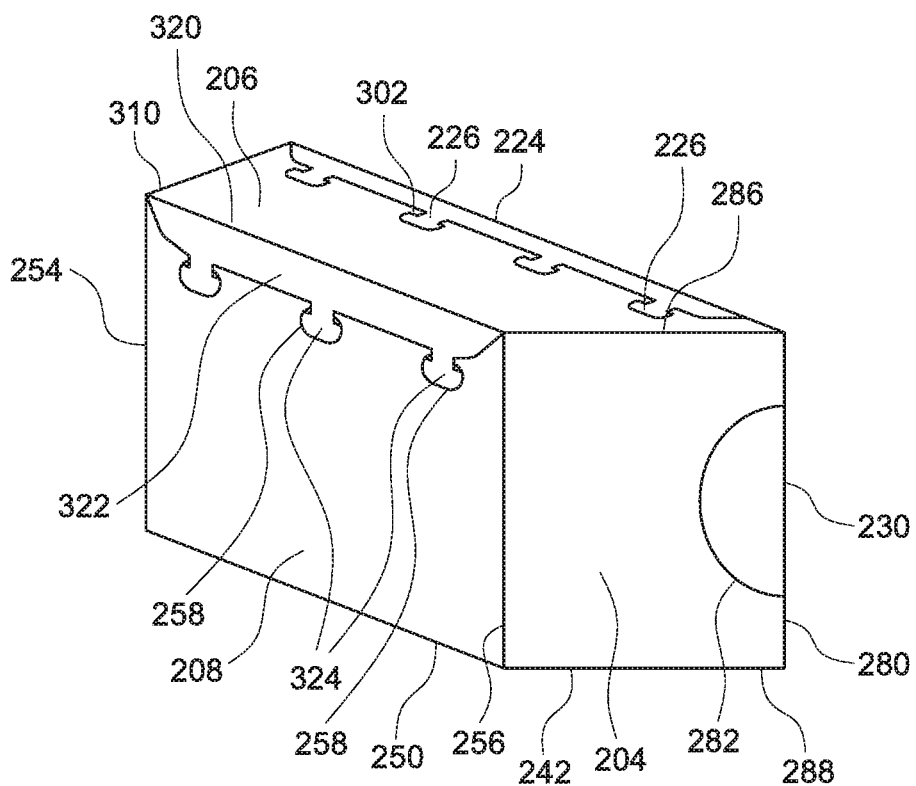
FIG. 2B is an opposite back perspective view of the example flexible air baffle structure in FIG. 1A.
Figure 3A:
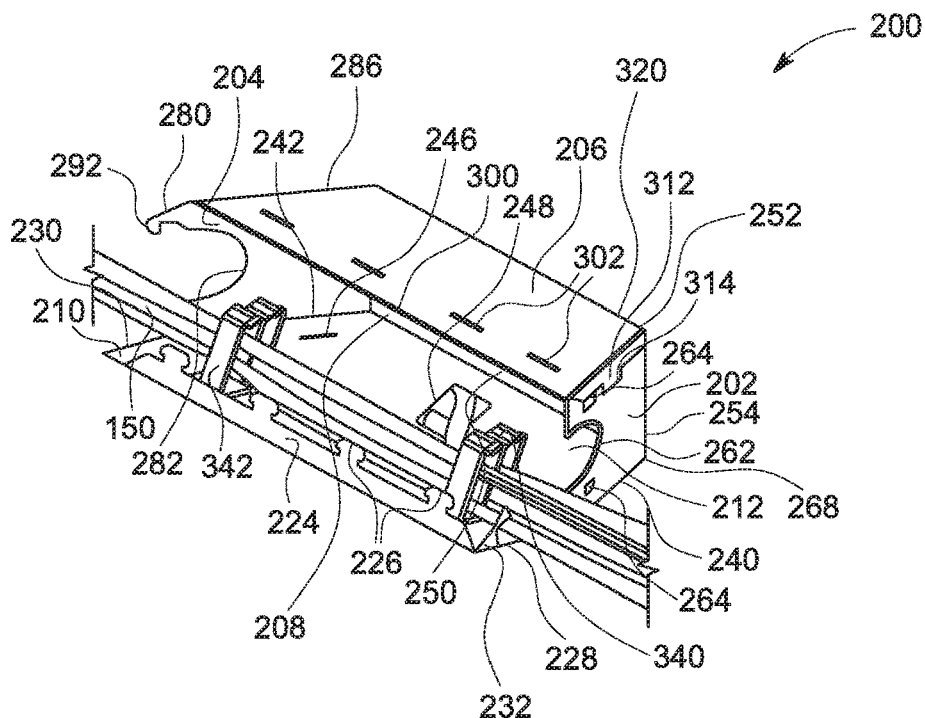
FIG. 3A is a perspective view of the example flexible air baffle in an open position prior to assembly to accommodate cables.
Figure 3B:
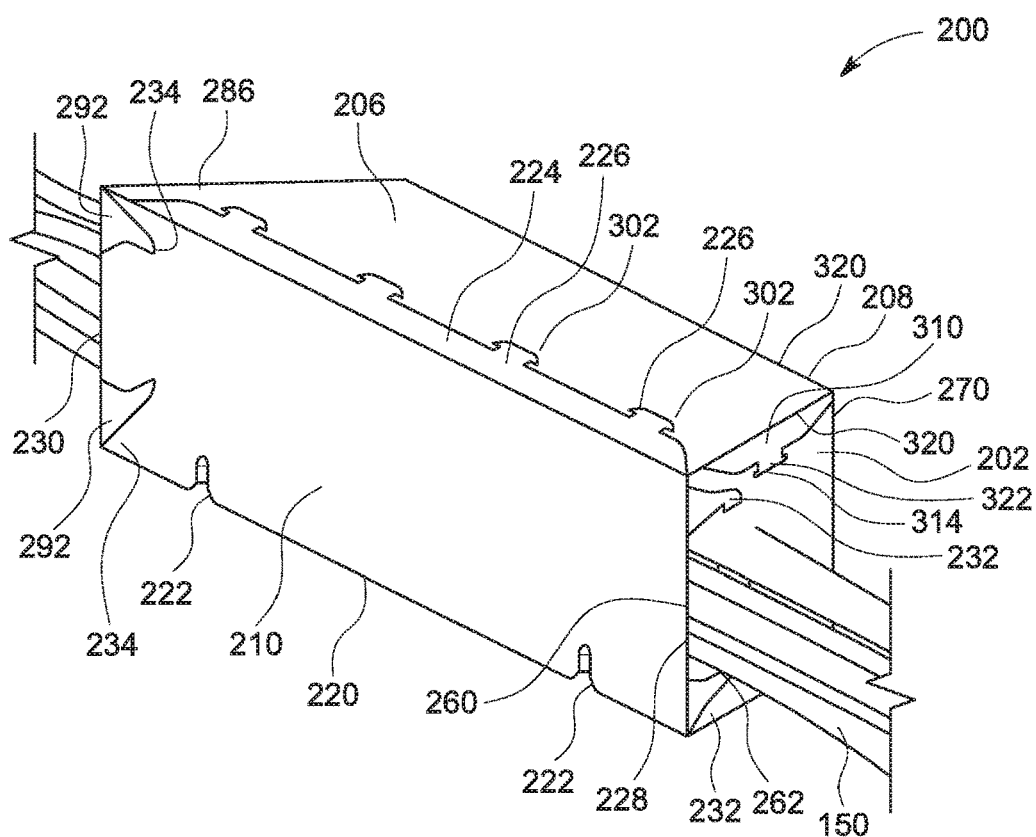
FIG. 3B is a perspective view of the example flexible air duct in a closed position with the inserted cables.
Figure 4A:
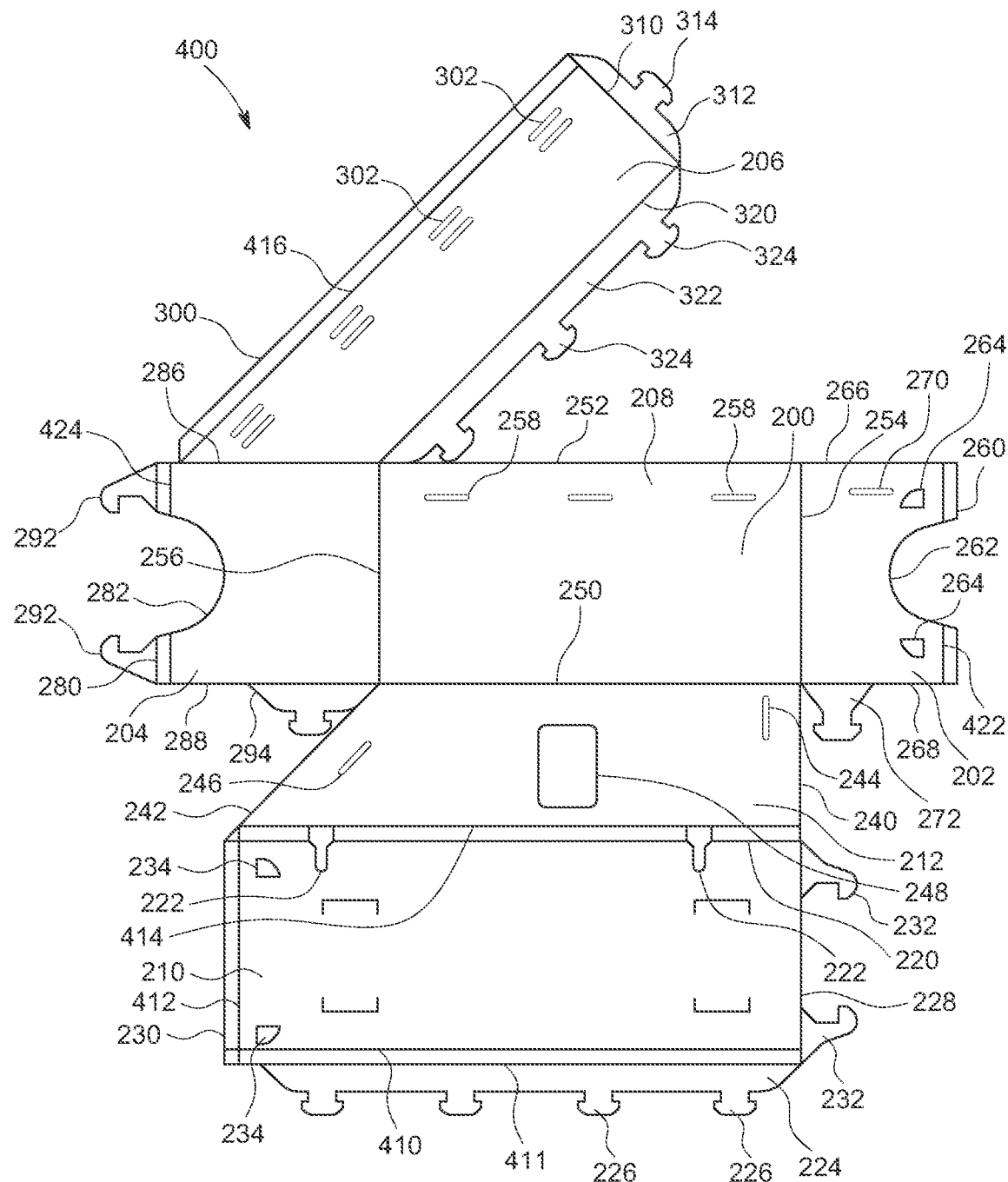
FIG. 4A shows a pre-fabricated sheet used to create the example baffle structure.

FIG. 2A shows a perspective view of the flexible baffle structure 200 in FIG. 1A-1C from a front view. FIG. 2B shows a perspective view of the flexible baffle structure 200 in FIGS. 1A-1C from an opposite back view. FIG. 3A shows the flexible baffle structure 200 in FIGS. 1A-1C in an open position to allow the insertion of cables 150 in FIGS. 1A-1C. FIG. 3B is a perspective view of the flexible baffle structure 200 in an assembled state supporting the cables 150. FIG. 4A shows an initial pre-fabricated flat sheet 400 that forms the flexible baffle structure 200 prior to folding the different walls and panels to form the assembled baffle structure 200 shown in FIGS. 2A-2B. Like elements in FIGS. 1A-4A have identical element numbers.

As shown in FIG. 4A, the air baffle structure 200 in an unassembled form is a single sheet of flexible material 400 that includes six panels constituting the end walls 202 and 204, the side walls 208 and 210, the top panel 206, and an opposite bottom panel 212. In this example, the sheet of flexible material 400 is a polyester or plastic sheet such as Mylar®, but other materials that may be folded to stay in place, and are of sufficient thickness to direct airflow may be used. Thus, the flexible baffle structure 200 may be constructed as the pre-fabricated and pre-cut planar sheet 400. The planar sheet 400 may be folded to the dimensions desired for the particular chassis. The flexible baffle structure 200 allows a reduction in design and molding costs for baffles in computing devices such as GPU servers.

In this example, the side wall 210 includes a common edge 220 with the bottom panel 212. A pair of slots 222 are formed on the side wall 210 near the common edge 220. The slots 222 are fit to pins on the chassis 110 to keep the baffle structure 200 in place. Alternatively, other mechanisms such as screws, clips, or the like may be used to fix the baffle structure 200 in place relative to the side wall 112 and the GPU tray 130.

The side wall 210 also includes an engagement flap 224 that runs parallel to the common edge 220. The engagement edge 224 includes protruding tabs 226 forming an open end of the engagement flap 224. In this example, there are four protruding tabs 226, but there may be fewer or more tabs depending on the desired length of the baffle 200. As will be explained, the engagement flap 224 is folded perpendicular to the side wall 210 to join the side wall 210 to the top panel 206. A pair of side edges 228 and 230 in combination with the common edge 220 and the engagement flap 224 define the surface of the side wall 210. The side edge 228 includes two protruding tabs 232. The two protruding tabs 232 are bent perpendicular to the top panel 206 to engage slots in the end wall 202. Two holes 234 are formed near the side edge 230. The holes 234 hold tabs from the end 204 when the baffle structure 200 is assembled.

The bottom panel 212 includes two opposite open edges 240 and 242 that are aligned with the end walls 202 and 204 respectively, when the baffle structure 200 is assembled. A slot 244 is formed in the bottom panel 212 in proximity to the open edge 240. As will be explained, a tab on the end wall 202 is inserted in the slot 244 to join the end wall 202 to the bottom panel 212. A slot 246 is formed in the bottom panel in proximity to the open edge 242. As will be explained, a tab on the end wall 204 is inserted in the slot 246 to join the end wall 204 to the bottom panel 212. The bottom panel 212 includes an aperture 248 for routing cables under the baffle structure 200 when the baffle structure is inserted in the gap 132 shown in FIG. 1C.

The bottom panel 212 shares a common edge 250 with the side wall 208. The side wall 208 also shares an opposite, and parallel, common open edge 252 that is joined with the top panel 206 when the air baffle structure 200 is fully assembled. The side wall 208 includes a common edge 254 with the end wall 202, and a common edge 256 with the end wall 204. The edges 254 and 256 are parallel to each other, and perpendicular with the edges 250 and 252. The edges 250, 252, 254, and 256 therefore define the planar area of the side wall 208. A series of three slits 258 are formed in proximity to the open edge 252. The slits 258 hold tabs on the top panel 206 when the top panel 206 is folded to join the open edge 252.

In this example, the end wall 202 is attached to the side wall 208 at the common edge 254. The end wall 202 includes an open edge 260 that is joined to the side edge 228 of the bottom panel 212. The end wall 202 includes a semi-circular cutout 262 near the open edge 260 that permits the cables 150 to enter the baffle structure 200. The end wall 202 also includes holes 264 near the open edge 260 that engage the tabs 232, on the side edge 228 of the side wall 210 when the air baffle structure 200 is assembled. When the baffle structure 200 is assembled, the open edge 260 of the end wall 202 is joined with the open side edge 228 of the side wall 210. The end wall 202 includes two opposite edges 266 and 268 that are each perpendicular to the common edge 254 and the open edge 260. The edges 254, 260, 266, and 268 thus define the planar area of the end wall 202. A slot 270 is formed in proximity to the edge 266. The slot 270 accepts a tab to attach the top panel 206 to the end wall 204 when the air baffle structure 200 is assembled. When assembled, the edge 260 of the end wall 202 is joined with the side edge 228 of the side wall 210. The edges 266 and 268 are joined with the respective top panel 206 and bottom panel 212. A tab 272 extends from the edge 268 and is inserted in the slot 244 of the bottom panel 212 to join the bottom panel 212 to the end wall 202 when the baffle structure 200 is assembled.

In this example, the end wall 204 is attached to the side wall 208 at the common edge 256. The end wall 204 includes an open edge 280 that is joined to the side edge 230 of the bottom panel 212. The end wall 204 includes a semi-circular cutout 282 near the open edge 280 that permits the cables 150 to enter the baffle structure 200. When the baffle structure 200 is assembled, the open edge 280 of the end wall 202 is joined with the open side edge 230 of the side wall 210. The end wall 204 includes a common edge 286 and an opposite edge 288 that are perpendicular to the common edge 256 and the open edge 280. The common edge 286 is attached to the top panel 206. The edges 256, 280, 286, and 288 thus define the planar area of the end wall 204. The edge 280 has tabs 292 protruding therefrom. The two tabs 292 are bent perpendicularly to the end wall 204 to engage the respective holes 234 on the side wall 210 near the edge 230. Thus, when assembled, the edge 288 of the end wall 204 is joined with the edge 242 of the bottom panel 212. A tab 294 extends from the edge 288 and is inserted in the slot 246 of the bottom panel 212 to join the bottom panel 212 to the end wall 204 when the baffle structure 200 is assembled.

The top panel 206 includes the common edge 286 with the end wall 204. The top panel 206 includes an opposite open edge 300 parallel to the common edge 252. Two rows of slots 302 are provided near the open edge 300. As will be explained below, the rows of slots 302 are spaced at two different lengths from the open edge 300 to allow the width of the example air baffle structure 200 to be adjusted. The slots 302 engage the respective tabs 226 of the engagement flap 224 of the side wall 210, when the side wall 210 is joined to the top panel 206 to create the assembled air baffle structure 200. The top panel 206 also includes an edge 310 that is joined to the open edge 266 of the end wall 202 when the air baffle structure 200 is assembled. The edge 310 includes an engagement flap 312 that includes a tab 314 that is folded perpendicular to the top panel 206, and inserted in the slot 270 of the end wall 202.

An opposite open edge 320 engages the open edge 252 of the side wall 208 when the air baffle structure 200 is assembled. An engagement flap 322 extends from the open edge 320. The engagement flap 322 includes three tabs 324 that are inserted in the respective slots 258 of the side wall 208.

As shown in FIG. 3A, the interior surface of the side wall 210 may hold cable clips 340 and 342. In this example, the cable clips 340 and 342 are glued to the interior of the side wall 210. The side wall 210 may include visual indicators to assist in the placement of the cable clips 340 and 342. The cable clips 340 and 342 hold the cables 150 in place relative to the interior surface of the side wall 210. Depending on the number of cables and the length of the baffle structure 200, additional clips may be used.

Figure 4B:
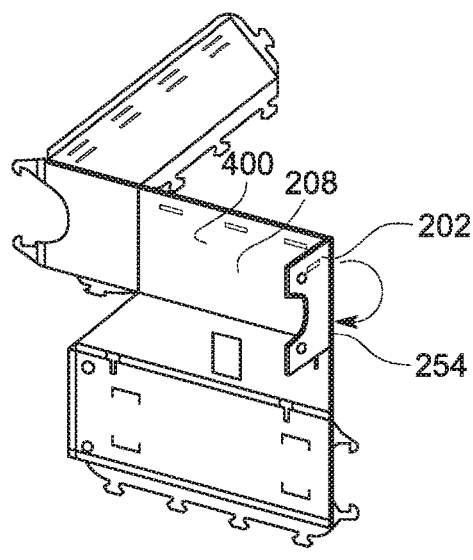
Figure 4C:
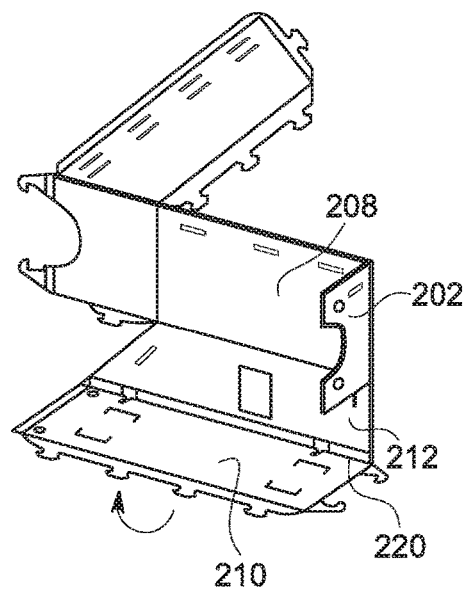
Figure 4E:
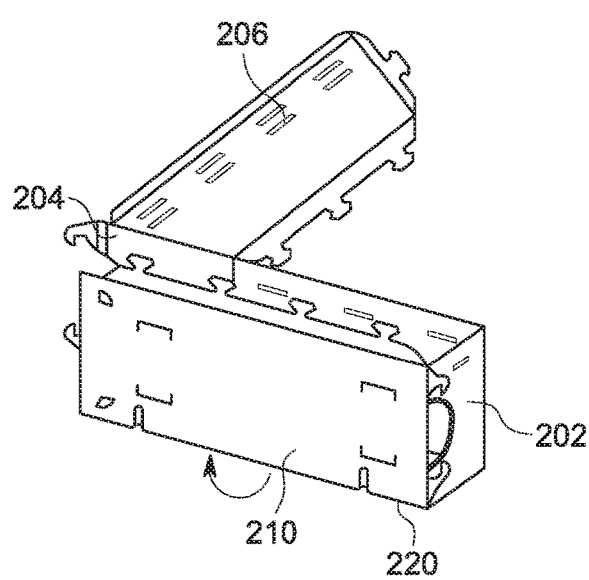

Prior to installing the air baffle structure 200 in a server chassis, the sheet 400 is formed by stamping out the shape shown in FIG. 4A. The panels and walls of the initial pre-fabricated sheet 400 are folded and joined together to form the baffle structure 200. Since the baffle structure 200 is a single flat sheet, the shape of the sheet 400 may be cut out from a sheet of material. FIGS. 4B-4E show the process of assembling the air baffle structure 200 from the initial sheet 400 in FIG. 4A. Initially, the end wall 202 is folded along the common edge 254 to a perpendicular position relative to the side wall 208 as shown in FIG. 4B. Then, the side wall 210 is folded to a perpendicular position to the bottom panel 212 along the common edge 220 as shown in FIG. 4C. The bottom panel 212 is then folded to a perpendicular position relative to the side wall 208 on the common edge 250. This results in the already folded side wall 210 to be positioned parallel to the side wall 208, as shown in FIG. 4D.

Figure 4F:
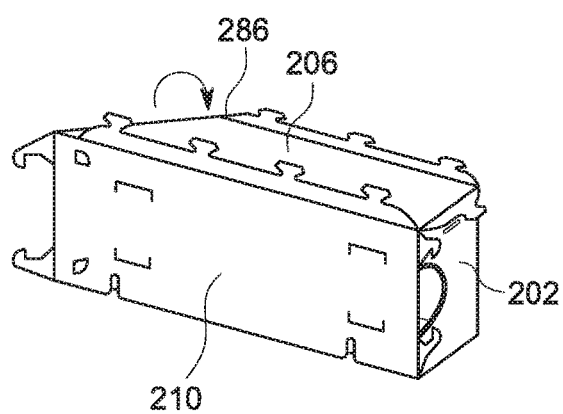

The end wall 204 may then be folded into place to close the open end formed by the side wall 208, bottom panel 212, and top panel 206. The top panel 206 may then be folded along the common edge 286 to join the side walls 208 and 210, and end wall 202 as shown in FIG. 4F. The engagement flap 312 of the top panel 206 is then folded so the engagement flap 312 rests on the end wall 202. The tab 314 is then inserted in the slot 270 to attach the end wall 202 to the top panel 206. The engagement flap 322 is folded to rest on the side wall 208. The tabs 324 are then inserted in the slots 258 on the side wall 208 to attach the top panel 206 to the side wall 208.

The engagement flap 224 of the side wall 210 is then folded so the engagement flap 224 rests on the top panel 206. The tabs 226 are then inserted in the respective slots 302 to attach the side wall 210 to the top panel 206. The tabs 292 of the end wall 204 are then inserted in the holes 234 of the side wall 210 to attach the end wall 204. The tabs 232 of the side wall 210 are inserted in the holes 264 of the end wall 202 to attach the end wall 202. The tab 272 of the end wall 202 is folded to be inserted in the slot 244 of the bottom panel 212. The tab 294 of the end wall 204 is folded to be inserted in the slot 246 of the bottom panel 212. The baffle structure 200 may then be inserted in a chassis to channel air away from gaps between the components and the chassis.

Alternatively, as shown in FIG. 3A, the side wall 210 may be kept in an open position without attaching the end walls 202 and 204. This allows open access to the space formed by the end walls 202 and 204, side wall 208, bottom panel 212, and top panel 206. In this partial assembly, the baffle structure 200 may be positioned over the gap 132 between the wall 112 and the GPU tray 130, as shown in FIG. 1C. The cables 150 may be inserted in the cable clips 340 and 342, while the side wall 210 is folded outward as shown in FIG. 3A. Once the cables 150 are secured in the clips 340 and 342, the side wall 210 may be folded to contact the open edge 300 of the top panel 206. The engagement flap 224 is folded in a perpendicular position to the side wall 210. The tabs 226 are then inserted in the respective slots 302 in the top panel 206 to attach the top panel 206 to the side wall 210. The tabs 232 of the side wall 210 are folded to be inserted in respective holes 264 on the end wall 202. The tabs 292 of the end wall 204 are folded to be inserted in the holes 234 in the side wall 210. The tab 272 of the end wall 202 is folded to be inserted in the slot 244 of the bottom panel 212. The tab 294 of the end wall 204 is folded to be inserted in the slot 246 of the bottom panel 212. The now completely assembled baffle structure 200 may then be lowered into final position in the chassis 110.

Figure 5A:
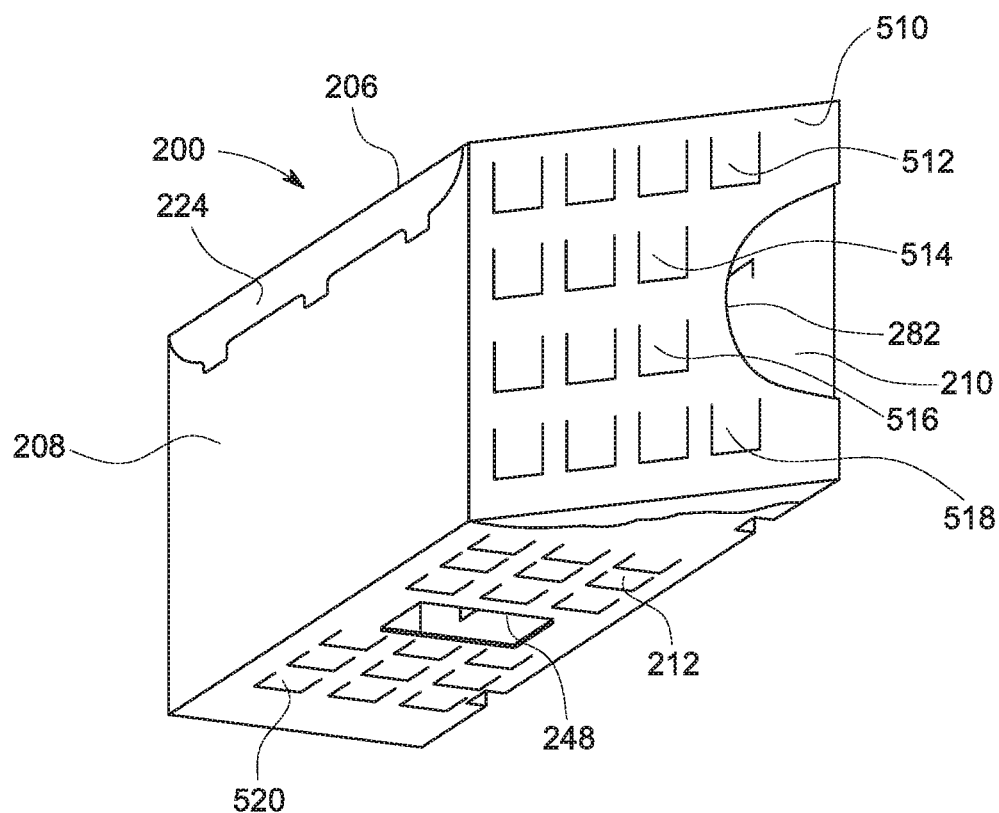
FIG. 5A is a perspective view of the example air baffle of FIG. 1A with optional scoring to create openings formed in the baffle wall.
Figure 5B:
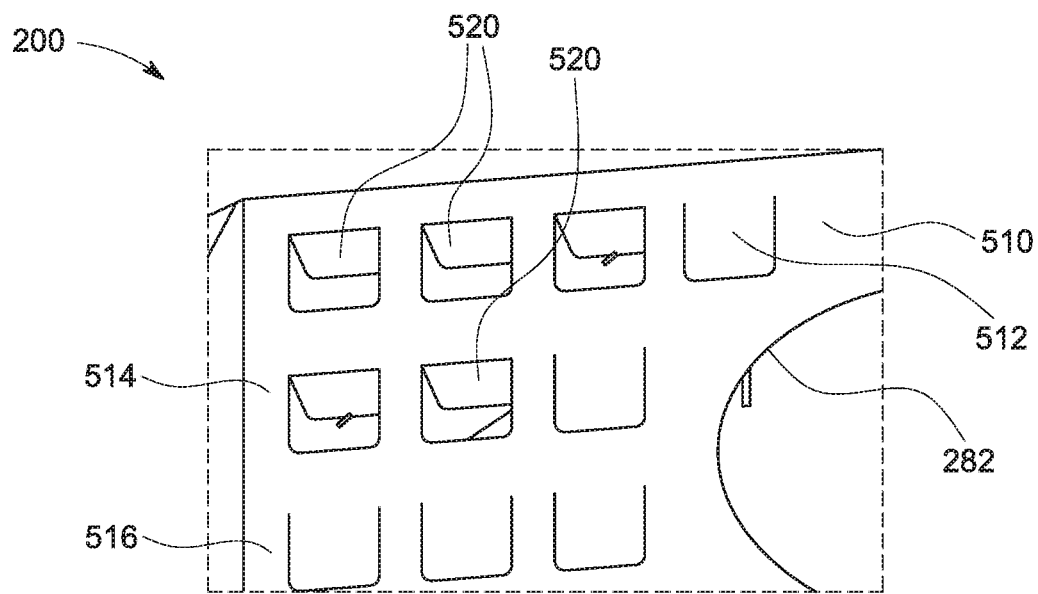
FIG. 5B is a perspective view of the example air ducts with certain openings created by removing the scored areas.

FIGS. 5A-5B show a variation of the baffle structure 200 that allows adjustment to different heat efficiency requirements. Like elements in FIGS. 5A-5B are provided with identical reference numbers as their counterparts in FIGS. 1-4. In the alternate baffle structure 200 shown in FIG. 5A, the end wall 204 in FIG. 2B has been replaced with an end wall 510 that may be configured to allow some air to flow through the baffle structure 200. The end wall 510 includes rows of cutouts 512, 514, 516, and 518. The rows of cutouts 512 and 518 each have four cutouts in this example. The rows of cutouts 514 and 516 each have three cutouts in this example. In this example, the cutouts are rectangular in shape and include one side joined to the end wall 510 with a U-shaped slit. Of course, any number of rows having any number of cutouts having other shapes may be used. Each of the cutouts may be in a closed position as shown in FIG. 5A where the cutouts are roughly planar with the end wall 510 to block air flow.

The heat efficiency of the overall cooling system may be adjusted by folding some or all of the cutouts of the rows 512, 514, 516, and 518 away from the end wall 510, thus creating an opening for air flow. In this manner, some air is diverted through the baffle structure 200 from the air flow deflected by the end wall 510, and thus the volume of air flow to the GPU tray 130 may be adjusted. FIG. 5B shows one example configuration where certain cutouts in the rows 512 and 514 have been folded backwards creating openings 520 for air to flow in the air baffle structure 200. Other cutouts in the rows 512 and 514, and all the cutouts in the rows 516 remain closed in this example.

Similar cutouts may also be cut into either the top panel 206 or the bottom panel 212 to allow openings for cables to be inserted from the top or the bottom of the air baffle structure 200 when placed in the chassis 110 in FIG. 1A. For example, the bottom panel 212 includes cutouts 520 that may be folded away from the bottom panel 212 to create additional openings for cables. Similar cutouts may be formed on the top panel 206.

The disclosed sheet 400 in FIG. 4A may also be adjusted to be assembled for different width air baffle structures. Thus, by folding the top and bottom panels 206 and 212 along different pre-folding lines, different air baffle structures may be assembled to match different sized gaps between the heatsinks on the GPU tray and the walls of the chassis.

As shown in FIG. 4A, a set of different fold lines may be formed on the top panel 206, the bottom panel 212, side walls 208 and 210, and end walls 202 and 204. As shown in FIGS. 4A-4F, fold lines are created on the common edges 220, 250, and 286. A fold line such as a fold line 411 is created for the engagement flap 224. The sheet 400 may include a set of different fold lines to provide a different width baffle structure. For example, an alternate fold line 410 may be located in parallel to the open edge of the side wall 210 for the engagement flap 224. Another fold line 412 may be located parallel to the edge 230 of the side wall 210. Another fold line 414 may be located on the bottom panel 212 parallel to the common edge 220. Finally, a fold line 416 may be located on the top panel 206 parallel to the edge 300. Assembling the air baffle structure 200 along the fold lines 410, 412, 414, and 416 allows a user to select a different width than folding along the common edges 220 and 250. The height of the end walls 202 and 204 may also be adjusted based on respective fold lines 422 and 424 that parallel the respective open edges 260 and 280.

Figure 6A:
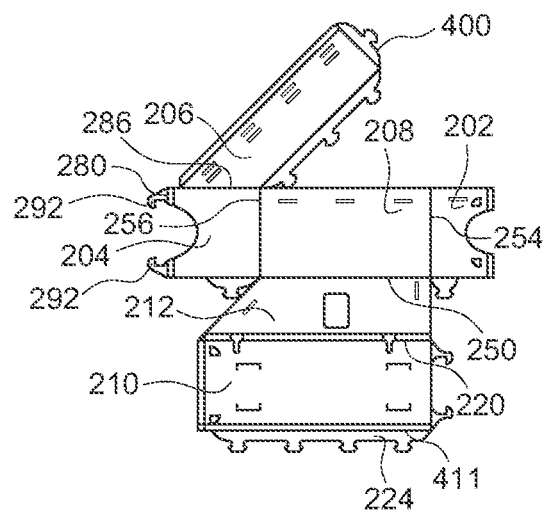
FIGS. 6A-6B show one assembly of the example flexible baffle structure with a first width.
Figure 6B:
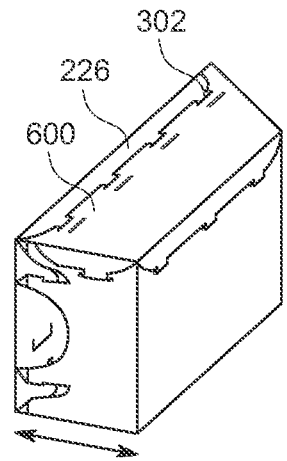

Thus, the width between the side walls 208 and 210 may be adjusted depending on which set of fold lines are used to fold the side wall 210 relative to the bottom panel 212. FIG. 6A highlights the fold lines on the sheet 400 that may be used to create a resulting baffle structure 600 shown in FIG. 6B that has a first width. In this example, the side wall 210 is folded along a fold line defined by the common edge 220 in relation to the bottom panel 212. The bottom panel 212 is folded on a fold line defined by the common edge 250 relative to the side wall 208. The end wall 202 is folded along a fold line defined by the common edge 254 with the side wall 208. The end wall 204 is folded along a fold line defined by the common edge 256 with the side wall 208. The top panel 206 is folded along a fold line defined by the common edge 286 with the end wall 204.

The tabs 292 are folded at a fold line defined by the open edge 280 of the end wall 204. The engagement flap 224 is folded along the fold line 420 at the edge of the side wall 210. As may be seen in FIG. 6B, the tabs 226 are inserted in a first row of the slots 302 on the top panel 206 that are in closer proximity to the edge 300. In this manner, the width between the side walls 208 and 210 is relatively large.

Figure 6C:
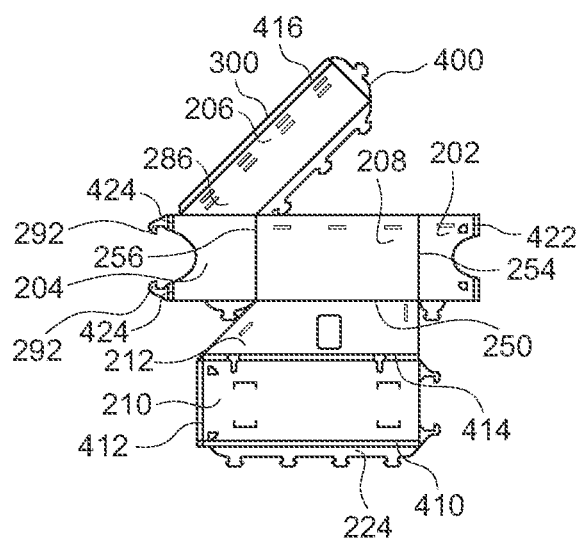
FIGS. 6C-6D shows another assembly of the example flexible baffle structure with a second width.
Figure 6D:
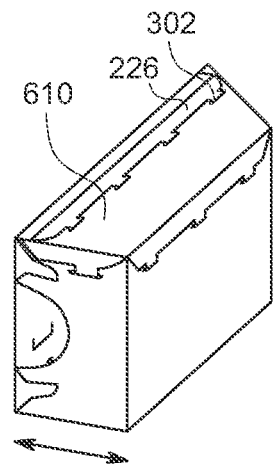

An air baffle structure 610 with a relatively shorter width between the side walls 208 and 210 may be formed from the sheet 400 as shown in FIGS. 6C and 6D. In this example, FIG. 6C highlights the fold lines on the sheet 400 that may be used to create the baffle structure 610 shown in FIG. 6D that has a narrower width with the height as the baffle structure 600 in FIG. 6B. In this example, the side wall 210 is folded along the fold line 414 in relation to the bottom panel 212. The bottom panel 212 is folded on a fold line defined by the common edge 250 relative to the side wall 208. The end wall 202 is folded along a fold line defined by the common edge 254 with the side wall 208. The end wall 204 is folded along a fold line defined by the common edge 256 with the side wall 208. The top panel 206 is folded along a fold line defined by the common edge 286 with the end wall 204. In this manner, the height of the side walls 208 and 210 and the end walls 202 and 204 are the same as their counterparts in the baffle structure 600 in FIG. 6B.

Part of the edge of the end wall 202 is folded along the fold line 422 to decrease the width of the end wall 202. Similarly, the tabs 292 are folded at the fold line 424 to decrease the width of the end wall 204. The width of the top panel 206 is decreased by folding the edge 300 at the fold line 416. The edge 230 of the side wall 210 is folded at the fold line 412 to match the shorter width of the end wall 204. The engagement flap 224 is folded along the fold line 410 that is set of from the edge of the side wall 210. As may be seen in FIG. 6D, the tabs 226 are inserted in a second set of the slots 302 on the top panel 206 that are in further proximity to the edge 300. In this manner, the width between the side walls 208 and 210 in the baffle structure 610 is narrowed relative to their position in the baffle structure 600 in FIG. 6B.

Thus, the sheet 400 forming the baffle structure 200 may be adapted for different types of GPU trays having variable widths. Further, the baffle structure 200 may also be adjusted for different chassis widths or locations in a chassis that have different widths between areas where air may be redirected. This flexibility allows the deployment of baffle structure 200 instead of baffles with specialized shapes requiring extra plastic molding and costs.

Figure 7A:
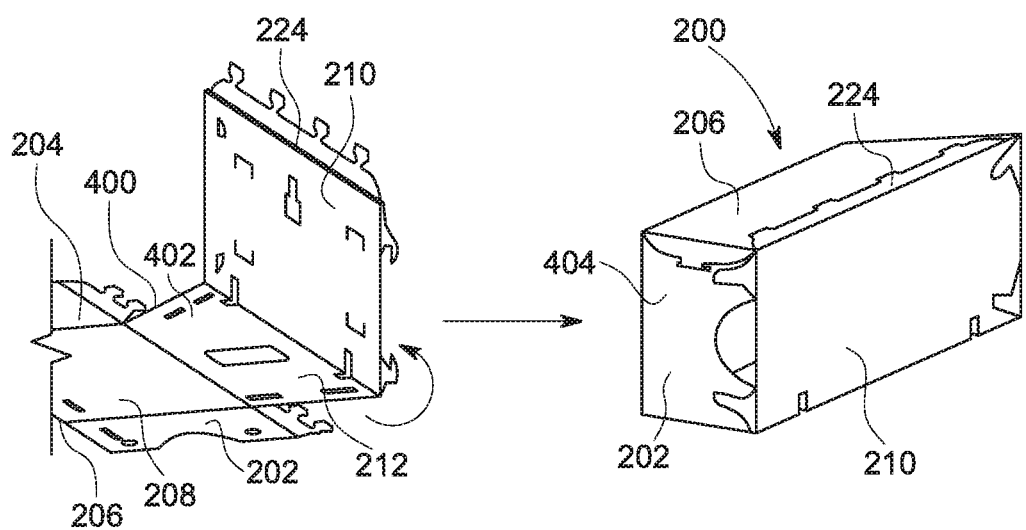
FIG. 7A shows one orientation of folding to create one assembly of the baffle structure.

The pre-fabricated sheet 400 in FIG. 4A may be assembled with different folds to be assembled in the baffle structure 200 on one side of the chassis 110 in FIG. 1B or assembled as the baffle structure 201 on the opposite side of the chassis 110 in FIG. 1B. This may be accomplished by changing the folding direction of the side wall 210 and the subsequent folding of the end walls 202 and 204 and the top panel 206. As shown in FIG. 7A, the baffle structure 200 is assembled from the pattern sheet 400 by folding the side wall 210 upward initially. After folding the side wall 208 upward, the end walls 202 and 204 are folded in place, and the top panel 206 is folded to join the engagement flap 224 of the side wall 210 to complete the assembled baffle structure 200. The pre-fabricated sheet 400 has a first surface 402 and an opposite surface 404. In the process of assembling the baffle structure 200, the first surface 402 is the interior surface of the walls 202, 204, 208, and 210, and the panels 206 and 212, while the opposite surface 404 is the exterior surface of the walls and panels.

Figure 7B:
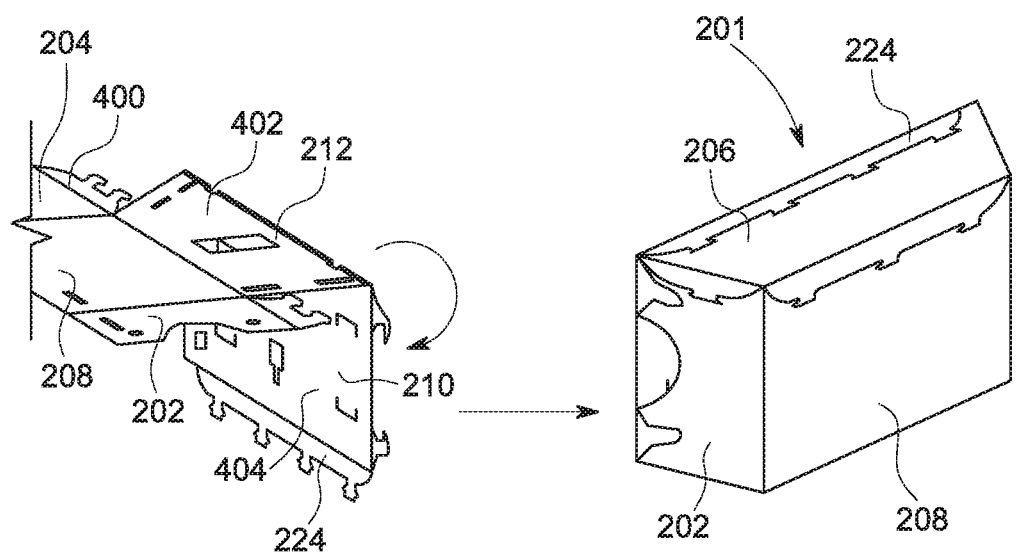
FIG. 7B shows an opposite orientation of folding to create another assembly of the baffle structure.

As shown in FIG. 7B, the baffle structure 201 may also be created from the pre-determined sheet 400 by initially folding the side wall 210 downward. After folding the side wall 208 downward, the end walls 202 and 204 are folded in place, and the top panel 206 is folded to join the engagement flap 224 of the side wall 210 to complete the assembled baffle structure 201. In the process of assembling the baffle structure 201, the first surface 402 is the exterior surface of the walls 202, 204, 208, 210, and the panels 206 and 212, while the opposite surface 404 is the exterior surface of the walls and panels. Thus, in this configuration the interior surfaces of the end walls 202 and 204, side walls 208 and 210 and panels 206 and 212 in the baffle structure are reversed from the assembly of the baffle structure 200.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An air baffle insertable between a wall and a computer component, the air baffle comprising a single sheet having:
   a bottom panel;
   a top panel having an open edge;
   a pair of parallel side walls, one of the side walls connected to the bottom and top panels via common edges, wherein the opposite one of the side walls is connected to the bottom panel via a common edge, and has an open edge that is attachable to the open edge of the top panel; and
   a first end wall joined to the side walls and the top and bottom panel, the first end wall directing air flow toward the computer component.

2. The air baffle of claim 1, wherein the first end wall is positioned at an angle relative to the plane of the side walls.

3. The air baffle of claim 1, wherein the first end wall includes a cutout to accommodate cables.

4. The air baffle of claim 1, wherein the first end wall includes a cutout to create an opening to alter air flow blocked by the first end wall.

5. The air baffle of claim 1, wherein the single sheet is a flexible material cut in shapes defining the walls and panels.

6. The air baffle of claim 5, wherein the flexible material is one of polyester or plastic.

7. The air baffle of claim 1, wherein the computer component is a GPU tray having a GPU and a heat sink.

8. The air baffle of claim 1, further comprising a second end wall joined to the side walls and the top and bottom panel opposite the first end wall.

9. The air baffle of claim 1, wherein the top panel or the bottom panel have a plurality of fold lines, wherein a width of the top panel or the bottom panel is adjusted based on folding the top panel or the bottom panel relative to the side walls along one of the plurality of fold lines.

10. A computing system comprising:
    a chassis having two side walls;
    a fan module generating air flow parallel to the two side walls of the chassis;
    a tray holding components, the tray located between the two side walls; and
    an air baffle insertable between one of the side walls and the tray, the air baffle including:
      a bottom panel;
      a top panel having an open edge;
      a pair of parallel side walls, one of the side walls connected to the bottom and top panels via common edges, wherein the opposite one of the side walls is connected to the bottom panel via a common edge, and has an open edge that is attachable to the open edge of the top panel; and
      a first end wall joined to the side walls and the top and bottom panel, the first end wall directing air flow toward the tray.

11. The computing system of claim 10, wherein the first end wall is positioned at an angle relative to the plane of the parallel side walls.

12. The computing system of claim 10, wherein the first end wall includes a cutout to accommodate cables.

13. The computing system of claim 12, wherein at least one of the side walls includes a protruding tab from an open edge that is inserted in a corresponding slot formed in the top panel.

14. The computing system of claim 10, wherein the first end wall includes a cutout to create an opening to alter air flow blocked by the first end wall.

15. The computing system of claim 10, wherein the single sheet is a flexible material cut in shapes defining the walls and panels.

16. The computing system of claim 15, wherein the flexible material is one of polyester or plastic.

17. The computing system of claim 10, wherein the components include a GPU and a heat sink.

18. The computing system of claim 10, further comprising a second end wall joined to the side walls and the top and bottom panel opposite the first end wall.

19. The computing system of claim 10, wherein the top panel or the bottom panel have a plurality of fold lines, wherein a width of the top panel or the bottom panel is adjusted based on folding the top panel or the bottom panel relative to the side walls along one of the plurality of fold lines.

20. An air baffle insertable between a wall and a computer component, the air baffle comprising a single sheet having:
   a bottom panel;
   a top panel;
   a pair of parallel side walls, each connected to the bottom and top panels, wherein at least one of the side walls includes a protruding tab from an open edge that is inserted in a corresponding slot formed in the top panel; and
   a first end wall joined to the side walls and the top and bottom panel, the first end wall directing air flow toward the computer component.

* * * * *